United States Patent [19]
Erickson

[11] Patent Number: 6,020,633
[45] Date of Patent: Feb. 1, 2000

[54] INTEGRATED CIRCUIT PACKAGED FOR RECEIVING ANOTHER INTEGRATED CIRCUIT

[75] Inventor: Brian D. Erickson, Soquel, Calif.

[73] Assignee: Xilinx, Inc., San Jose, Calif.

[21] Appl. No.: 09/047,321

[22] Filed: Mar. 24, 1998

[51] Int. Cl.[7] .......................... H01L 23/48; H01L 23/34; H01L 23/12

[52] U.S. Cl. ...................... 257/723; 257/678; 257/693; 257/700; 257/704

[58] Field of Search ................................. 257/723, 678, 257/693, 700, 704

[56] References Cited

U.S. PATENT DOCUMENTS

| | | | |
|---|---|---|---|
| 5,212,403 | 5/1993 | Nakanishi et al. | 257/664 |
| 5,598,033 | 1/1997 | Behlen et al. | 257/686 |
| 5,646,828 | 7/1997 | Degani et al. | 361/715 |
| 5,652,466 | 7/1997 | Hirakawa et al. | 257/772 |

FOREIGN PATENT DOCUMENTS 5-233844  9/1993  Japan .

*Primary Examiner*—Mahshid Saadat
*Assistant Examiner*—Jhihan B. Clark
*Attorney, Agent, or Firm*—Edel M. Young; E. Eric Hoffman

[57] ABSTRACT

An integrated circuit combination includes a second piggy-back small integrated circuit chip mounted on the carrier of a first integrated circuit chip. The combination can be mounted on a board without requiring board space for interconnecting the first and second chips. The lid of the first chip is cut away so that the second chip can be mounted to the first without increasing the height of the combination over the height of the first chip. The two chips preferably comprise an FPGA and a PROM for programming the FPGA. The combination increases security as well as reducing board space because it is difficult to read a bitstream being transmitted from the PROM to the FPGA when the PROM is directly mounted on the FPGA.

15 Claims, 2 Drawing Sheets

INTEGRATED CIRCUIT PACKAGED FOR RECEIVING ANOTHER INTEGRATED CIRCUIT

FIELD OF THE INVENTION

This invention relates to the packaging of combinations of integrated circuit devices.

BACKGROUND OF THE INVENTION

FIG. 1 shows a cross sectional side view of a conventional chip package 1 comprising an integrated circuit 11 mounted on a multi-layer printed circuit board 12. Wire bonds 13 connect pads of the integrated circuit 11 to printed circuit board wiring 14 that provide electrical connection to balls 15 at the lower surface of package 1. The integrated circuit 11 and wire bonds 13 are protected by cover 16.

As integrated circuit technology has progressed, both integrated circuits and the boards and systems into which they are installed have become more complex. Integrated circuit packages are available with a very large number of pins for connecting circuits inside the integrated circuit to the board. Indeed, ICs are known with close to 1000 pins or balls. As the number of pins increases, the difficulty of making a board with connecting lines (routing resources) to the pins also increases. Connecting lines on the board typically lead to other integrated circuit devices. It is desirable to minimize the number of these lines needed to form a desired system.

One solution to the proliferation of lines on a board is to stack several integrated circuit packages on top of each other. Behlen et al. in U.S. Pat. No. 5,598,033 describe a stacking scheme for micro-BGA packages so as to provide a high density integrated circuit package. FIG. 2, taken from FIG. 3 of Behlen et al., shows a package that can be stacked. As shown in FIG. 2, package 2 includes an interposer 312 comprising an upper layer 340 and a lower layer 338. Balls 314 at the lower surface connect to connectors below, for example to another integrated circuit package or to a printed circuit board. Contact pads 326 connect to structures above, for example another identical package. FIG. 3, taken from FIG. 4 of Behlen et al, shows a stack of such packages. Such a structure has the disadvantage of increasing the height of the system board that must be allowed for the stack.

Another solution to the problem of increasing complexity and proliferation of lines on a system printed circuit board is to form multi-chip packages or modules (MCMs). Several chips having many connections between themselves are placed into a single package. They are interconnected through a small board or large chip within the package, and the board or the chips are connected to pins that extend from the package. Thus a MCM package installed into a board requires less board area and wiring than would the individual chips within the package, and also requires fewer lines on the board to make the interconnections. The structure may also require less height than the stack of FIG. 3.

FIG. 4 is taken from FIG. 1 of Degani et al. U.S. Pat. No. 5,646,828 and shows a MCM structure 17 comprising integrated circuit chips 18, 19, and 20. These chips are located in a cavity 16 of the package 4. Chip 18 interconnects chips 19 and 20 and connects to the outside through wires 22 to contact pads 23 and then via thruholes 24 to other levels of the printed circuit board and to contacts 25 and solder bumps 26 at the lower surface of the printed circuit board. FIG. 4 also shows connections to other chips or electronic devices such as 27 and 28 on the upper surface of the printed circuit board. Further discussion of these two prior art structures appears in the respective patents and is incorporated herein by reference.

MCMs are expensive to manufacture, and a MCM requires considerable planning ahead to assure that the modules are available to install into boards when they are needed. Further, upgrading one of the chips in a MCM requires a redesign of the MCM as well as the chip within the MCM.

Thus it is desirable to have a package that is both inexpensive, easy to upgrade, and low profile, as well as a package able to minimize the need for wiring resources on a printed circuit board.

It is also desirable to prevent observation of the signals being passed between chips.

SUMMARY OF THE INVENTION

According to the invention, a packaged integrated circuit is formed having conventional pins or balls for attaching to a board at its bottom surface or edges. In addition, this package includes a cutout from the cover at the upper surface of the package exposing contacts to which a second small chip can be attached without increasing the height of the loaded board on which the chip combination is mounted.

The structure is particularly advantageous when the integrated circuit in the cutout package is a field programmable gate array (FPGA) and the second chip mounted to the upper surface at the cutout is a PROM for programming the FPGA. (The packaged integrated circuit may include more than one cutout and receive more than one chip at its upper surface.) With this arrangement, the packaged integrated circuit may operate with a variety of second chips attached in a piggyback manner to the packaged integrated circuit. After the packaged integrated circuit is manufactured and even placed into a system, the second chips may be designed and modified. Different second chips may be used in different applications, and the cost of upgrading a board having an upgraded second chip is only the cost of upgrading the second chip, not the cost of upgrading the packaged integrated circuit.

The packaged integrated circuit is manufactured without any second chip attached. Then a user of the packaged integrated circuit may add the second chip as desired. Unlike a MCM, the separately packaged chips have been completely manufactured before being connected together, so the testing and handling procedures are simplified and the cost is lower.

In one embodiment, an unprogrammed serial PROM is installed on an FPGA package and programmed while it is attached to the FPGA. After power is turned off and then on, the PROM programs the FPGA by means well known in the art.

DETAILED DESCRIPTION OF THE DRAWINGS OF THE INVENTION

Figure 1:
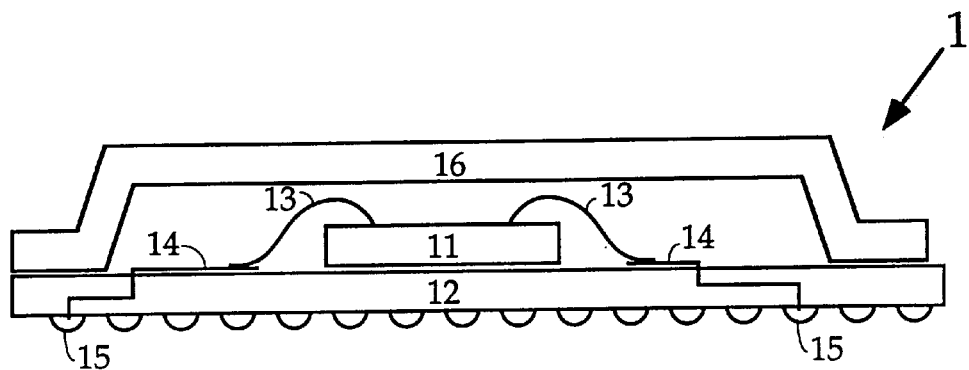
FIG. 1 shows a prior art integrated circuit ball grid array package.
Figure 2:
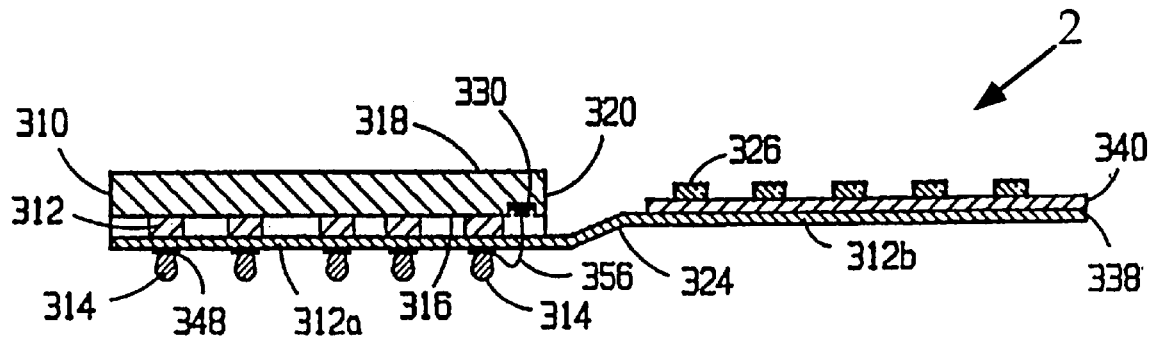
FIG. 2 shows the prior art stackable package illustrated in U.S. Pat. No. 5,598,033.
Figure 3:
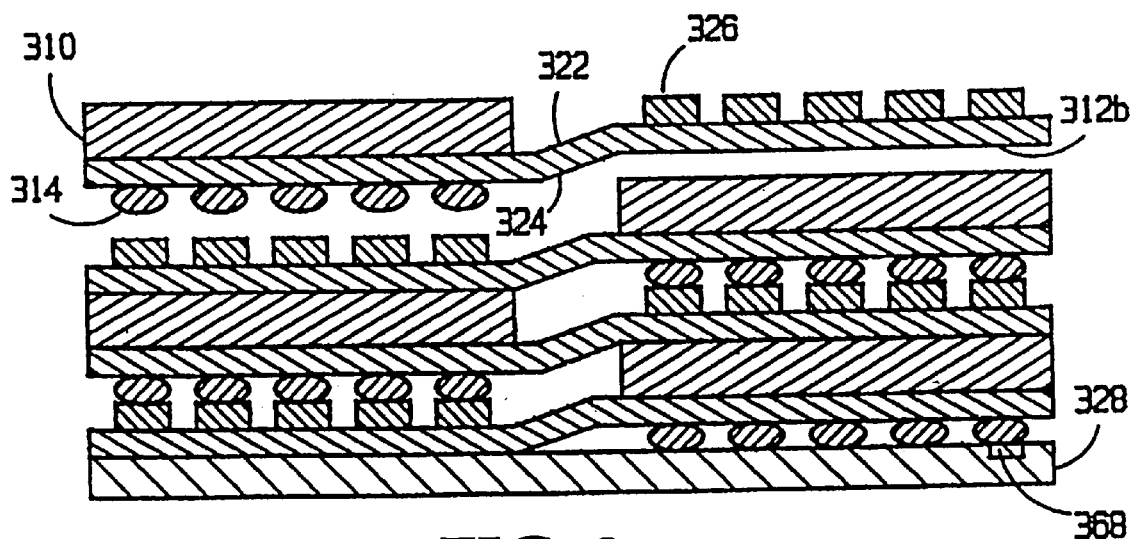
FIG. 3 shows a stack of the packages of FIG. 2.
Figure 4:
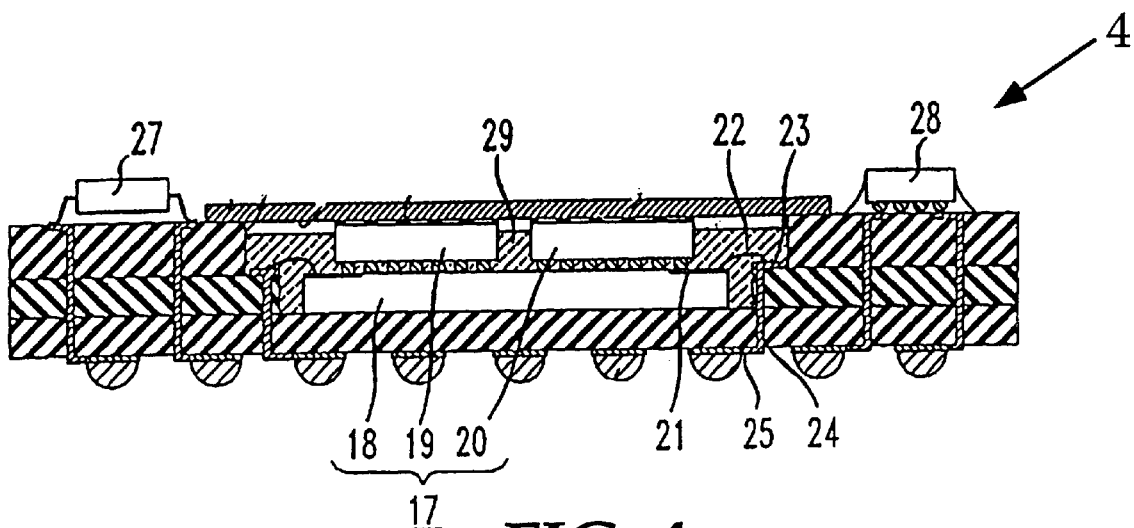
FIG. 4 shows a prior art MCM illustrated in U.S. Pat. No. 5,646,828.
Figure 5:
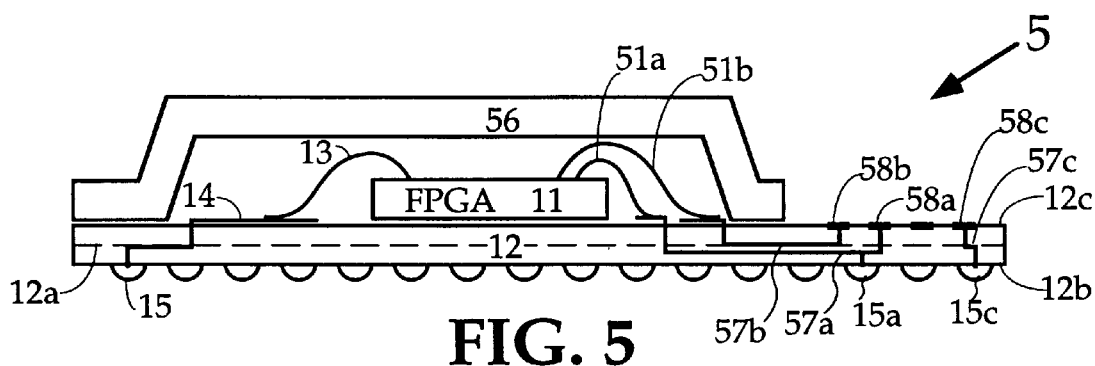
FIG. 5 shows a package according to the invention.

FIG. 5 shows a cross section of a structure according to the invention. Printed circuit board carrier 12 is preferably formed in two layers, thus providing three surfaces, top, middle, and bottom for conductive traces. Carrier 12 includes four types of traces, those from a wire bond to a ball at the lower surface, for example trace 14 from wire bond 13 to ball 15 at lower surface 12*b*, those from a wire bond to a contact at the upper surface, for example trace 57*b* from wire bond 51*b* to contact 58*b* at the upper surface 12*c*, those from a wire bond to both upper and lower surfaces, for example from wire bond 51*a* to ball 15*a* at lower surface 12*b* and to contact 58*a* at upper surface 12*c*, and those that simply connect upper surface to lower surface, for example, trace 57*c* from contact 58*c* to ball 15*c*. Note that FIG. 5 is drawn to illustrate electrical connections, not layout. In an actual layout, wire bonds 51*a* and 52*b* are typically horizontally adjacent each other, so that only one of these wires will show in a vertical cross sectional view. Also, traces 57*a* and 57*b* will typically occupy the same combination of layers on the printed circuit board rather than occupying different layers as suggested by the drawing. Also, typically, many more traces exist in an actual printed circuit board, but are not shown here in order to avoid obscuring the invention.

Preferably, when a PROM will be attached to package 5, electrical connections to contacts 58 include power and ground and all signal connections for programming a PROM as well as signal connections for PROM to program the FPGA 11. Connections from FPGA 11 to balls 15 include all other connections plus, of course, power and ground connections.

Figure 6:
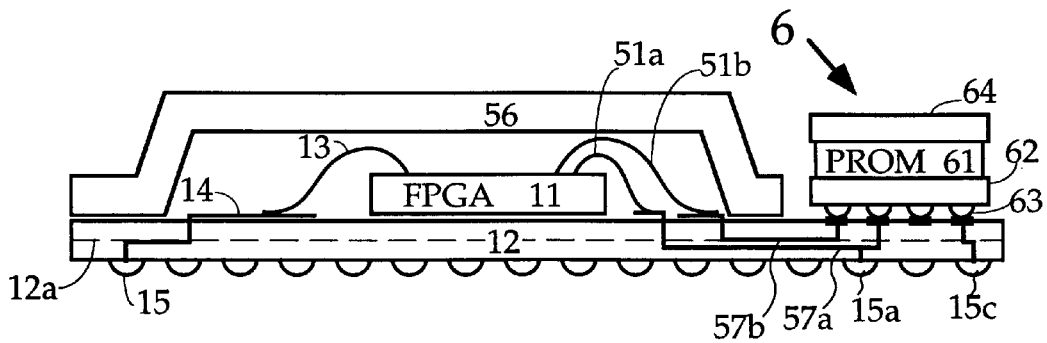
FIG. 6 shows an FPGA-PROM combination according to the invention.

FIG. 6 shows the structure of FIG. 5 with a PROM package 6 attached. PROM package 6 includes PROM chip 61 enclosed and protected by a chip-size package having a lower cover 62 and an upper cover 64. Balls 63 extend from the lower surface of package 6 and connect to contacts 58 of package 5. With this type of chip-sized PROM package, the height clearance of a board to which the combination will be connected is not increased by adding PROM package 6. Further, different PROMs can be attached to different FPGAs depending upon the use to which the FPGA will be put. Indeed, in some embodiments, the same wiring connections 57 can accommodate either a PROM for configuring the FPGA or another chip for performing another function (for example memory), depending upon the use to be made of the FPGA.

In one embodiment, an unprogrammed serial PROM is installed in the exposed cutout area of the FPGA package, then the FPGA is partly configured to activate JTAG boundary scan features within the FPGA, thus allowing the serial PROM to be programmed while it is attached to the FPGA. Such an operation can be accomplished by indicating to the FPGA that the PROM is downstream in a daisy chain from the FPGA, as is described at pages 13–25 through 13–32 of the Xilinx Programmable Logic Data Book published September 1996 and available from Xilinx, Inc., 2100 Logic Drive, San Jose, Calif. 95124, which pages are incorporated herein by reference. When the combination of FPGA and PROM are again powered up, the PROM configures the FPGA and the combination is ready to operate.

Other embodiments of the invention will become obvious to those skilled in the art in light of the above description. For example, although the figures illustrate a package having a ball grid array at the lower surface of the package, another embodiment has perimeter contacts, as found in a plastic quad flat pack or plastic leaded chip carrier package. These embodiments are intended to form part of the invention as well.

I claim:

1. A combination of integrated circuit packages comprising:
    an FPGA package comprising:
        an FPGA chip;
        a printed circuit board carrier having:
            a first electrical conductor extending through the printed circuit board carrier, the FPGA chip being connected to the first electrical conductor at an upper surface of the printed circuit board carrier;
            a second electrical conductor extending through the printed circuit board carrier, the FPGA chip being connected to the second electrical conductor at the upper surface of the printed circuit board carrier;
            a third electrical conductor extending through the printed circuit board carrier;
            a fourth electrical conductor extending through the printed circuit board carrier, the FPGA chip being connected to the fourth electrical conductor at the upper surface of the printed circuit board carrier;
            a first connector element connected to the second electrical conductor at a lower surface of the printed circuit board carrier, the first connector element being formed to couple the printed circuit board carrier to a printed circuit board;
            a second connector element connected to the third electrical conductor at the lower surface of the printed circuit board carrier, the second connector element being formed to couple the printed circuit board carrier to the printed circuit board; and
            a third connector element connected to the fourth electrical conductor at the lower surface of the printed circuit board carrier, the third connector element being formed to couple the printed circuit board carrier to the printed circuit board; and
    a PROM package comprising:
        a PROM chip, separate from the FPGA chip, wherein the PROM chip is connected to the first electrical conductor, the third electrical conductor and the fourth electrical conductor at the upper surface of the printed circuit board carrier.

2. A combination of integrated circuit packages as in claim 1 wherein the PROM is programmable by passing signals through the FPGA.

3. A combination of integrated circuit packages as in claim 1 wherein the PROM can configure the FPGA.

4. A combination of integrated circuit packages as in claim 1 wherein the first electrical conductor carries a data signal.

5. A combination of integrated circuit packages as in claim 1 wherein the first electrical conductor is wholly contained within the printed circuit board carrier.

6. The combination of claim 5 wherein the first electrical conductor is dedicated for routing configuration data from the PROM chip to the FPGA chip.

7. An integrated circuit package comprising:
    a first integrated circuit chip;
    a carrier having upper and lower surfaces comprising:
    a first conductive line that extends through the carrier, the first integrated circuit chip being connected to the first conductive line at the upper surface of the carrier, and
    a second conductive line that extends between the upper and lower surfaces of the carrier, the first integrated circuit chip being connected to the second conductive line at the upper surface of the carrier;
    a third conductive line that extends between the upper and lower surfaces of the carrier;

a fourth conductive line that extends between the upper and lower surfaces of the carrier, the first integrated circuit chip being connected to the fourth conductive line at the upper surface of the carrier;

a first connector element connected to the second conductive line at the lower surface of the carrier, the first connector element being formed to connect the carrier to a printed circuit board;

a second connector element connected to the third conductive line at the lower surface of the carrier, the second connector element being formed to connect the carrier to the printed circuit board; and a third connector element connected to the fourth conductive line at the lower surface of the carrier, the third connector element being formed to connect the carrier to the printed circuit board; and a second integrated circuit chip separate from the first integrated circuit chip, wherein the second integrated circuit chip is connected to the first conductive line, the third conductive line, and the fourth conductive line at the upper surface of the carrier; and a lid attached to the carrier, wherein the lid is shaped to cover the first integrated circuit chip and to leave uncovered the second integrated circuit chip.

8. An integrated circuit package as in claim 7 wherein the lid is at least as high as the second integrated circuit chip.

9. An integrated circuit package as in claim 7 wherein the first integrated circuit chip is an FPGA.

10. An integrated circuit package as in claim 7 wherein the first conductive line carries a data signal.

11. An integrated circuit package as in claim 7 wherein the first conductive line is wholly contained within the carrier.

12. An integrated circuit package as in claim 6 wherein the second integrated circuit chip is a PROM.

13. An integrated circuit package as in claim 12 wherein the PROM is programmable through the FPGA.

14. An integrated circuit package as in claim 12 wherein the PROM can program the FPGA.

15. The integrated circuit package of claim 11 wherein the first conductive line is dedicated for routing configuration data.

* * * * *